(12) United States Patent
Umemoto

(10) Patent No.: US 6,337,270 B2
(45) Date of Patent: Jan. 8, 2002

(54) PROCESS FOR MANUFACTURING SEMICONDUCTOR DEVICE

(75) Inventor: Takeshi Umemoto, Fukuyama (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 09/816,259

(22) Filed: Mar. 26, 2001

(30) Foreign Application Priority Data

Jun. 5, 2000 (JP) ............................................ 12-167644

(51) Int. Cl.[7] ................... H01L 21/4763; H01L 21/302; H01L 21/461
(52) U.S. Cl. ...................... 438/637; 640/689; 640/710
(58) Field of Search ................. 438/637, 640, 438/689, 710

(56) References Cited

U.S. PATENT DOCUMENTS 5,702,982 A * 12/1997 Lee et al. ................... 437/195
6,225,207 B1 * 1/2001 Parikh ........................ 438/622

FOREIGN PATENT DOCUMENTS

JP 7-201994 8/1995
JP 9-330877 12/1997

* cited by examiner

*Primary Examiner*—David Nelms
*Assistant Examiner*—Thao P. Le
(74) *Attorney, Agent, or Firm*—Nixon & Vanderhye P.C.

(57) ABSTRACT

A process for manufacturing a semiconductor device having a lower wiring layer, an interlayer insulating film and an upper wiring layer in this order and a connection hole formed in the interlayer insulating film on the lower wiring layer, wherein the connection hole is provided by the steps of: forming a photoresist layer on the interlayer insulating film; and forming in the photoresist layer an opening for the connection hole which exposes the interlayer insulating film at the bottom thereof and an opening for a dummy connection hole which does not expose the interlayer insulating film at the bottom thereof.

12 Claims, 1 Drawing Sheet

PROCESS FOR MANUFACTURING SEMICONDUCTOR DEVICE

CROSS-REFERENCE TO RELATED APPLICATION

Figure 1A:
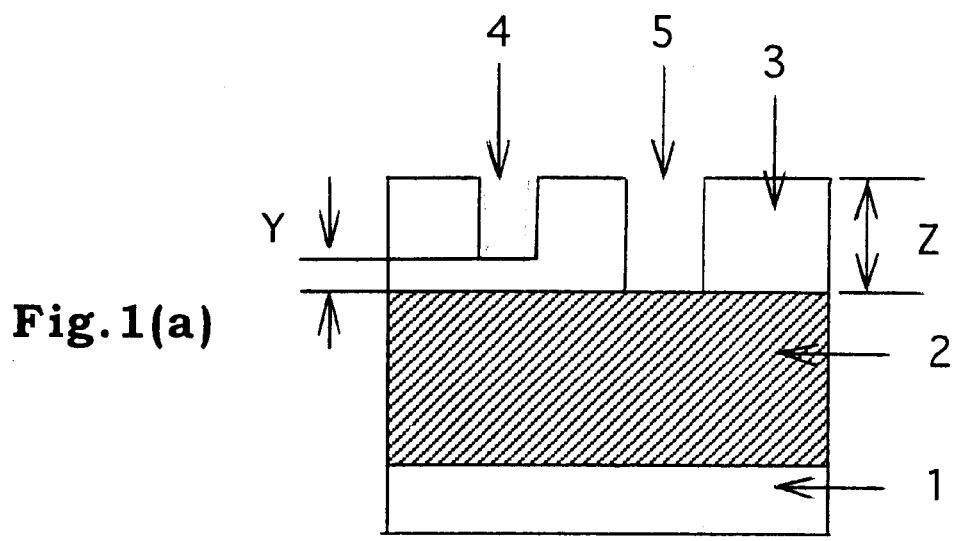

This application is related to Japanese application No. 2000-167644 filed on Jun. 5, 2000, whose priority is claimed under 35 USC § 119, the disclosure of which is incorporated by reference in its entirety.

BACKGROUND OF THE INVENTION

1. Field of the Invention

The present invention relates to a process for manufacturing a semiconductor device. In particular, it relates to a process for manufacturing a semiconductor device comprising an interlayer insulating film in which fine connection holes are formed to have a great aspect ratio and to reach a lower wiring layer.

2. Description of Related Art

As semiconductor devices are designed to be further miniaturized and wirings are multiplied, higher accuracy is required for miniaturization processes such as dry etching. For example, when a connection hole such as a contact hole is formed by etching, a diameter of the connection hole formed in an interlayer insulating film becomes small and an aspect ratio is increased. As a result, microloading effect (the smaller the diameter becomes, the more the etching rate is reduced or the etching is stopped) remarkably occurs, which causes malformation of the contact hole.

Further, after a photolithography step, the ratio of an area of the connection hole to an area of a resist film on a silicon wafer is reduced. Accordingly, an amount of CF gas in etching plasma is relatively increased in order to perform etching to a satisfactory degree under this condition. Then, a deposit derived from the CF gas is largely generated at the bottom of the connection hole, which raises electrical resistance of the connection hole. For example, it is known that use of a mask in which the ratio of the connection hole area (the ratio of the connection hole area with respect to an area of one chip) is as high as about 7% reduces the electrical resistance more, i.e., the CF deposit is reduced, as compared with use of a mask in which the ratio of the connection hole area is as low as about 3%.

In order to eliminate an excess of the CF gas, there has been proposed a method of introducing a small amount of oxygen-containing gas such as $O_2$ or CO into the plasma. However, in this method, O in the oxygen-containing gas and C in the resist film are reacted to form CO and then volatilized. This facilitates the reduction of the resist film and as a result, the connection hole is widened at the top thereof. This is problematic since an alignment margin (top borderless margin) is reduced. That is, if the connection hole is widened at the top thereof, short-circuit occurs between metal wiring layers (upper wiring layers) connected with the top portion of the connection hole. The connection hole and the wiring layer are generally designed to permit a certain degree of misalignment of them. However, as the semiconductor device is further miniaturized, the alignment margin for the photolithography step is reduced, which makes difficult to prevent the short-circuit. Misalignment between the wiring layers and the connection hole is referred to as "top borderless".

Further, as disclosed in Japanese Unexamined Patent Publication No. Hei 7 (1995)-201994, there has also been proposed a method of forming a dummy connection hole in addition to the connection hole, utilizing an etch stop layer in the interlayer insulating film. According to this method, oxygen is released in an etching atmosphere when the dummy connection hole is etched, an excess of the CF gas is eliminated and the amount of the CF deposit is controlled. Thus, the connection hole can be formed with high uniformity and reproducibility.

In order to control the amount of the CF deposit and to form the well-configured connection hole excellent in electrical properties with good reproducibility as described above, the dummy connection hole is generally provided to supply oxygen. However, the method of Japanese Unexamined Patent Publication No. Hei 7 (1995)-201994 requires additional steps of depositing an etch stop layer, removing the etch stop layer from a region for forming the connection hole and depositing an interlayer insulating film, as compared with the usual introduction of the oxygen-containing gas. Further, when the dummy connection hole reaches the etch stop layer, the surface of the insulating film formed of $SiO_2$ is not exposed so that the supply of oxygen for controlling the amount of the CF deposit is stopped. This is considered to increase the CF deposit at the bottom or the sidewalls of the connection hole. If the CF deposit is excessively generated at the bottom of the connection hole, defects of the semiconductor device such as increase in electrical resistance are resulted.

SUMMARY OF THE INVENTION

According to the present invention, provided is a process for manufacturing a semiconductor device having a lower wiring layer, an interlayer insulating film and an upper wiring layer in this order and a connection hole formed in the interlayer insulating film on the lower wiring layer, wherein the connection hole is provided by: forming a photoresist layer on the interlayer insulating film; and forming in the photoresist layer an opening for the connection hole which exposes the interlayer insulating film at the bottom thereof and an opening for a dummy connection hole which does not expose the interlayer insulating film at the bottom thereof.

In the present invention, a resist pattern as shown in FIG. 1(a) is formed to eliminate the steps of depositing an etch stop layer, removing the etch stop layer from a region for forming the connection hole and depositing an interlayer insulating film, which have been additionally performed in the method of Japanese Unexamined Patent Publication No. Hei 7 (1995)-201994, as well as washing steps and examining steps involved in these steps. Further, the present invention exhibits effects equivalent to those of the above-mentioned prior art by merely performing a photolithography step of forming the connection hole and a step of examining the thus formed connection hole. Moreover, since the dummy connection hole is formed without utilizing the etch stop layer, oxygen is supplied until the formation of the connection hole by etching is completed.

At the beginning of the etching, a resist layer exists at the bottom of the opening for the dummy connection hole. Therefore the amount of oxygen supplied by the interlayer insulating film is considered to be smaller than that in the method disclosed by Japanese Unexamined Patent Publication No. Hei 7 (1995)-201994. However, it is considered that the etching is not stopped since the aspect ratio of the connection hole is relatively small at the beginning of the etching. The oxygen is actually required when the aspect ratio of the connection hole is increased, namely, when the etching is finished. In the present invention, oxygen for controlling the amount of the CF deposit is sufficiently supplied at the time when the etching is completed.

When a gas capable of supplying oxygen such as $O_2$ or CO is used as the etching gas in a general use amount, the effect caused by oxygen is excessive so that the etching rate of the interlayer insulating film with respect to the lower wiring layer or the resist layer is reduced. That is, the amount of oxygen required for controlling the amount of the CF deposit is very small so that it is extremely difficult to adjust the amount by feeding a large amount of carrier gas. In the present invention, however, a required amount of oxygen is effectively supplied.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION THE DRAWINGS

Figure 1B:
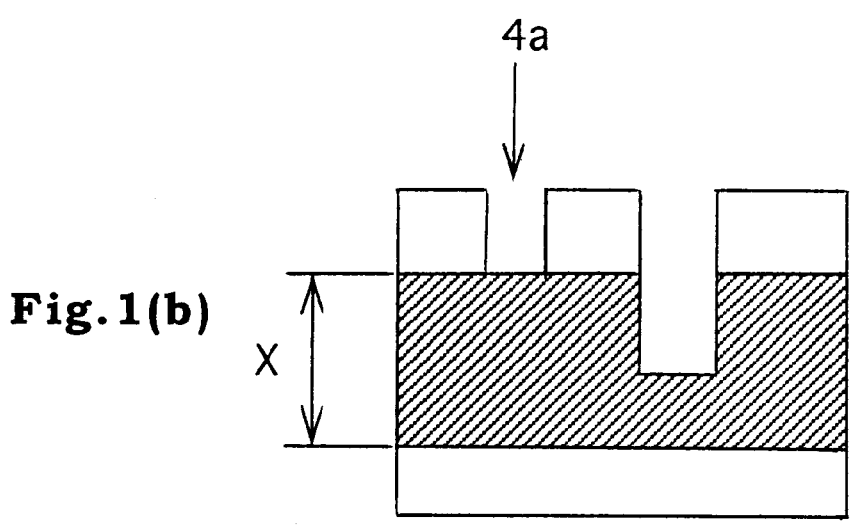
Figure 1C:
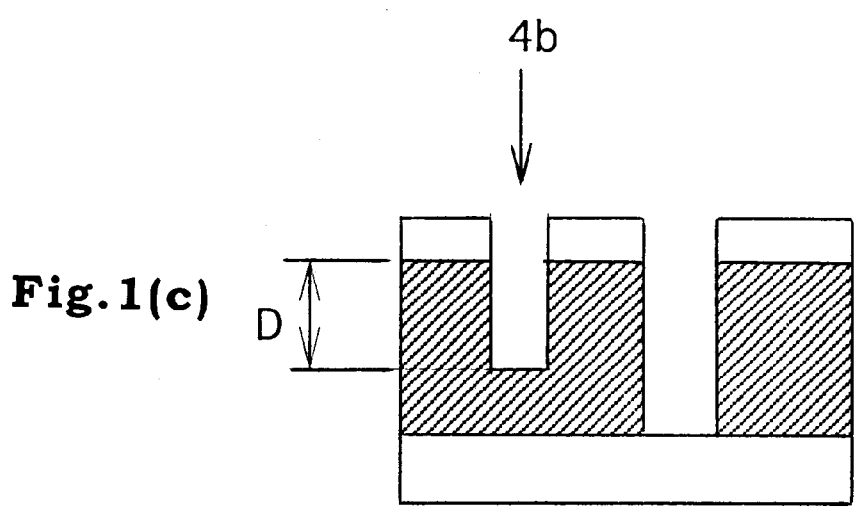

FIGS. 1(a) to 1(c) are schematic sectional views illustrating steps of a process for manufacturing a semiconductor device according to the present invention.

DESCRIPTION OF THE PREFERRED EMBODIMENTS

Hereinafter, the present invention will be described with reference to FIGS. 1(a) to 1(c).

The process for manufacturing the semiconductor device according to the present invention is proposed to solve the above-mentioned problems. More specifically, in a semiconductor device including an interlayer insulating film in which a connection hole reaching a lower wiring layer, a resist pattern 3 is formed so that a resist layer is left at the bottom of an opening 4 for a dummy connection hole in a thickness of Y obtained by a calculation method to be described later.

The resist pattern 3 is formed by a known method to have an opening 4 for the dummy connection hole with a controlled depth (see. FIG. 1(a)). In FIG. 1(a), reference numeral 1 denotes a lower wiring layer, 2 an interlayer insulating film and 5 an opening for a connection hole. For example, the resist pattern may be formed by the method disclosed in Japanese Unexamined Patent Publication No. Hei 9(1997)-330877.

In the opening for the dummy connection hole, the interlayer insulating film is not etched until the resist layer of the thickness Y is etched away to expose the interlayer insulating film. Therefore, the etching of the interlayer insulating film at the bottom of the opening for the dummy connection hole occurs behind the etching of the interlayer insulating film at the bottom of the opening 5 for the connection hole (see FIG. 1(b)). In FIG. 1(b), reference numeral 4a signifies the opening for the dummy connection hole exposing the interlayer insulating film at the bottom thereof. Thus, a dummy connection hole 4b which does not reach the lower wiring layer 1 is formed without providing an etch stop layer in the interlayer insulating film (see FIG. 1(c)).

The lower wiring layer mentioned in the present invention includes not only a lower wiring but also an active layer formed on a substrate. Accordingly, the connection hole includes a contact hole and a via hole. The lower wiring layer is a layer of metal such as Al, Cu and the like or an impurity diffusion layer. The upper wiring layer is a layer of metal such as Al, Cu and the like.

The method of calculating the thickness Y of the resist pattern at the bottom of the opening for the dummy connection hole is described below.

First, the etching rates of the interlayer insulating film and those of the resist layer in regions for forming the connection hole and the dummy connection hole, respectively, are estimated under the etching condition for forming the connection hole. For example, the etching rate of the interlayer insulating film for forming the connection hole is regarded as A, and the etching rate of the interlayer insulating film and that of the resist layer for forming the dummy connection hole are regarded as B and C, respectively. Further, etching time of the interlayer insulating film for forming the connection hole is represented by t and that for forming the dummy connection hole is represented by t'. B should be estimated with respect to a part of the dummy connection hole where the etching progresses most quickly. Accordingly, a time required for removing the resist layer at the bottom of the dummy connection hole to expose the interlayer insulating film is obtained by t−t'. Suppose the depth of the dummy connection hole opened by etching in the interlayer insulating film is D, the thickness Y of the resist layer is $Y=C\times(t-t')$. By the substitution with $t'=D/B$, an equation (1):

$$Y=C\times(t-D/B)$$

is obtained. Since B, C and t are known quantities, the thickness of the resist layer at the bottom of the dummy connection hole corresponding to the thickness D is obtained from the equation (1), while satisfying Y<Z (Z is a thickness of a part of the resist layer which is not patterned). The dummy connection hole is formed on condition that it does not reach the lower wiring layer so that $B\times t'<X$ (X is a thickness of the interlayer insulating film) is established. This condition leads to $Y>C\times(t-X/B)$. Therefore, the thickness of the resist layer at the bottom of the opening for the dummy connection hole needs to be greater than $C\times(t-X/B)$.

EXAMPLE

Hereinafter, the present invention will be described in further detail by way of an example, but the invention is not limited thereto.

The following example shows a calculation of the thickness of the resist layer at the bottom of the opening for the dummy connection hole provided in an interlayer insulating film of $SiO_2$ formed by low pressure CVD using a $O_3$/TEOS material. The calculation is similarly performed even if the interlayer insulating film is formed of other materials.

The interlayer insulating film of $SiO_2$ formed by low pressure CVD using the $O_3$/TEOS material is etched under the following conditions.

$C_4F_8/C_2F_6$/Ar=5/10/95 sccm (sccm: flow rate (ml)/min under 0° C. and 1 atm)

Source/bias power=1.9/1.4 kW Gas pressure=0.67 Pa

Source power is utilized to generate plasma by an ICP etcher and has an influence on dissociation of the etching gas. Bias power is applied to the wafer. The greater the bias power is, the more straight ions are attracted to the wafer, which makes the etching more anisotropic.

Under the condition, the etching rate of the interlayer insulating film at the bottom of the opening for the connection hole is estimated to be 750 nm/min (=A). The etching rates of the insulating film and the resist layer at the bottom of the opening for the dummy connection hole are 720 nm/min (=B) and 250 nm/min (=C), respectively.

For example, a metal wiring and an insulating film of $SiO_2$ are used as the lower wiring layer 1 and the interlayer insulating film, respectively. The thickness (X) of the interlayer insulating film is set to 900 nm and the thickness (Z) of the resist layer which is not patterned is 700 nm.

Exact etching time t required to complete the connection hole is estimated to be 900/750×60=72 seconds. For example, the thickness (D) of the dummy connection hole in the insulating film after completion of the etching is intended to be 500 nm, the thickness of the resist layer at the bottom of the opening for the dummy connection hole is about 300 nm, as obtained by substituting these values for the equation (1).

The thickness (D) of 500 nm is merely an example. It is not limited thereto and can suitably be determined depending on the thickness of the interlayer insulating film, as long as the dummy connection hole does not reach the lower wiring layer. The process of the present invention is suitably applied to the case where the aspect ratio of the connection hole (depth/diameter of the connection hole) is 5 or more. The present invention is more suitably applied to the case where the diameter of the connection hole is 260 nm or less (more preferably, to the case where the diameter is 150 to 260 nm).

The etching conditions, the area of the interlayer insulating film and the area of the opening for the dummy connection hole are described as an example and the present invention is not limited thereto.

In the present invention, the dummy connection hole is formed simultaneously with the etching of the fine connection hole having greater aspect ratio in a region other than that for the connection hole. Therefore, an excess of the CF gas is eliminated and the amount of the CF deposit at the bottom and on the sidewalls of the connection hole is controlled. Thus, well-configured connection hole having excellent electrical properties can be formed.

In the present invention, the opening for the dummy connection hole is formed by photolithography without exposing the interlayer insulating film. Further, the etching of the interlayer insulating film for forming the dummy connection hole is carried out behind that for forming the connection hole. Therefore, the dummy connection hole which does not reach the lower wiring layer is formed without providing the etch stop layer in the interlayer insulating film. At the beginning of the etching for forming the connection hole, a certain amount of the interlayer insulating film at the bottom of the connection hole is removed. As the etching progresses and the connection hole becomes deeper, the CF deposit starts to adhere to the sidewalls and the bottom of the connection hole. At this timing, the resist layer at the bottom of the opening for the dummy connection hole is etched away and the etching of the interlayer insulating film is started and oxygen radicals are generated. Thus, the above-mentioned deposit is removed and the etching of the connection hole is continued.

From the viewpoint described above, the present invention greatly contributes to processes for manufacturing the semiconductor devices including a step of etching connection holes such as contact holes and via holes based on the fine design rule, and thus it is highly valuable for industrial field.

What is claimed is:

1. A process for manufacturing a semiconductor device comprising a lower wiring layer, an interlayer insulating film and an upper wiring layer in this order and a connection hole formed in the interlayer insulating film on the lower wiring layer, wherein the process comprises:

forming a photoresist layer on the interlayer insulating film;

forming in the photoresist layer both (i) an opening for the connection hole which extends all the way through the photoresist layer and exposes the interlayer insulating film at the bottom thereof, and (ii) a dummy opening for a dummy connection hole which extends only part-way through the photoresist layer and does not expose the interlayer insulating film at the bottom thereof; and forming the connection hole in the interlayer insulating film using the opening for the connection hole in the photoresist layer, and forming the dummy connection hole in the interlayer insulating film using the dummy opening for the dummy connection hole in the photoresist layer.

2. A process according to claim 1, wherein the interlayer insulating film is formed of a $SiO_2$ type material layer.

3. A process according to claim 1, wherein, after the openings for the connection hole and the dummy connection hole are formed in the photoresist layer, the connection hole is provided in the interlayer insulating film by performing plasma etching to the bottom of the opening for the connection hole until the lower wiring layer is exposed.

4. A process according to claim 3, wherein the thickness of the photoresist layer at the bottom of the opening for the dummy connection hole is determined by a calculation from the etching rates of the photoresist layer and the interlayer insulating film so that a time for plasma etching to remove the photoresist layer at the bottom of the opening for the dummy connection hole and a time for plasma etching to remove the interlayer insulating film at the bottom of the opening for the connection hole are equalized.

5. A process according to claim 1, wherein the thickness of the photoresist layer at the bottom of the opening for the dummy connection hole is greater than C×(t−X/B) (wherein B and C are the etching rates of the interlayer insulating film and the photoresist layer, respectively, t is a time for etching, X is a thickness of the interlayer-insulating film).

6. A process according to claim 2, wherein the interlayer insulating film is a $SiO_2$ film formed by low pressure CVD using a $O_3$/TEOS material.

7. A process according to claim 1, wherein the connection hole has the aspect ratio of 5 or more.

8. A process according to claim 1, wherein the connection hole has a diameter of 260 nm or less.

9. A process according to claim 8, wherein the connection hole has a diameter of 150 to 260 nm.

10. The process of claim 1, wherein the upper wiring layer electrically communicates with the lower wiring layer through said connection hole formed in the interlayer insulating film.

11. The process of claim 10, wherein the dummy connection hole in the interlayer insulating film does not reach the lower wiring layer, and the dummy connection hole in the interlayer insulating film is formed via etching without providing an etch stop layer in the interlayer insulating film.

12. A process for manufacturing a semiconductor device comprising a lower wiring layer, an interlayer insulating film and an upper wiring layer in this order and a connection hole formed in the interlayer insulating film on the lower wiring layer, wherein the process comprises:

forming a photoresist layer on the interlayer insulating film;

forming in the photoresist layer (i) an opening for the connection hole which extends all the way through the photoresist layer and exposes the interlayer insulating film at the bottom thereof, and (ii) a dummy opening for a dummy connection hole which extends only part-way through the photoresist layer and does not expose the interlayer insulating film at the bottom thereof; and etching the interlayer insulating film using the photoresist layer until a point in time when said etching is stopped when the connection hole in the interlayer insulating film has reached the lower wiring layer but the dummy connection hole in the interlayer insulating layer has not reached the lower wiring layer, so that the connection hole and the dummy connection hole are simultaneously formed in the interlayer insulating film using the photoresist layer.

* * * * *